United States Patent [19]

Ohta et al.

[11] Patent Number: 4,835,061
[45] Date of Patent: May 30, 1989

[54] CONDUCTIVE LAMINATE

[75] Inventors: Tatsuo Ohta, Yamanashi; Hideo Watanabe; Mayumi Inaba, both of Tokyo, all of Japan

[73] Assignee: Konishiroku Photo Industry Co., Ltd., Tokyo, Japan

[21] Appl. No.: 882,959

[22] PCT Filed: Nov. 8, 1985

[86] PCT No.: PCT/JP85/00622

§ 371 Date: Jun. 18, 1986

§ 102(e) Date: Jun. 18, 1986

[87] PCT Pub. No.: WO86/02881

PCT Pub. Date: May 22, 1986

[30] Foreign Application Priority Data

Nov. 9, 1984 [JP] Japan .................................. 59-236442
Nov. 9, 1984 [JP] Japan .................................. 59-236443

[51] Int. Cl.$^4$ .......................... B32B 9/00; B32B 27/06
[52] U.S. Cl. .................................... 428/469; 428/212; 428/472.2; 428/480; 428/701; 174/68.5
[58] Field of Search ................ 428/1, 212, 469, 472.2, 428/480, 701; 174/68.5

[56] References Cited

U.S. PATENT DOCUMENTS

| 4,613,549 | 9/1986 | Tanaka | 428/469 |
| 4,622,120 | 11/1986 | Gillery | 204/192.26 |

FOREIGN PATENT DOCUMENTS

| 0047673 | 4/1977 | Japan | 428/701 |
| 0002241 | 1/1983 | Japan | 428/1 |
| 0009123 | 1/1983 | Japan | 428/1 |
| 0068726 | 4/1983 | Japan | 428/1 |

Primary Examiner—Nancy A. B. Swisher
Assistant Examiner—Patrick J. Ryan
Attorney, Agent, or Firm—Jordan B. Bierman

[57] ABSTRACT

A conductive laminate comprising a substrate (2), an intermedaite layer (3) provided on the substrate (2) and made of an amorphous metallic or semi-metallic oxide, and a transparent conductive layer (4) provided on the intermediate layer (3) and made of a crystalline metal or metallic oxide. The material of the conductive layer (4) is a member selected from among Au, Pd, Cr, Ni, $SnO_2$, $In_2O_3$, ZnO, $TiO_2$, CdO, $CdO—SnO_2$, and ITO. The material of the intermediate layer (3) is a member selected from among $SnO_2$, ITO, $SiO_2$ and $Al_2O_3$. The thickness of the conductive layer (4) is 200 to 10,000 Å. The thickness of the intermediate layer (3) is 80 to 300 Å.

8 Claims, 2 Drawing Sheets

CONDUCTIVE LAMINATE

DESCRIPTION

1. Technical Field

The present invention relates to a conductive laminate, and more specifically to a conductive laminate suitably used in display devices such as a liquid crystal display device.

2. Background Art

Transparent conductive films and transparent conductive laminates are widely used in the electric and electronic fields including those concerning not only electrodes for liquid crystal display devices, electroluminescence display devices, and photoconductive photosensitive elements, but also cathode ray tubes, electrostatic shielding layers in the window portions of various measurement apparatuses, antistatic layers, and heating elements. Of them, transparent conductive films having selective light transmittance has an infrared ray reflection property and are utilized as window materials in collectors for utilization of solar energy and in buildings. A transparent electrode never fail to be used in various solid display devices wherein an electroluminescence, liquid crystal, plasma, or ferroelectric substance is used, which have been developed as substitutes for cathode ray tubes with the progress of information processing technologies. Besides, a film having transparency and electroconductivity is required in new photoelectric elements and recording materials utilizing interaction or interconversion between electric and optical signals, which are regarded as useful in the information processing technique from now on. These transparent conductive layers can be utilized also in condensation-proof window glass used in automobiles, airplanes, etc., in antistatic films for polymers, glass, etc., and in transparent heat-insulating windows for prevention of dissipation of solar energy. In liquid crystal, electroluminescence, plasma, electrochromic, and fluorescence display devices, etc., a demand particularly for high-quality picture element display has recently increased. Under these circumstances, there has been a proposal according to which the portion of a picture element and the signal input line are formed with an electrode made of a transparent conductive layer and a low resistance electrode, respectively, to attain improvements in the display speed of the picture element and the quality of images.

On the other hand, patterning of the transparent conductive layer of a conductive laminate in display devices such as a liquid crystal display device is generally effected by photoetching, which includes the step of immersion in an alkali to remove a photoresist remaining on the conductive laminate and the step of washing the surfaces of the conductive laminate with an acid after patterning. In these steps, cracking or local peeling sometimes occurs in the transparent conductive layer, leading to a grave defect to the conductive laminate as will be described later.

Although the cause of the above-mentioned phenomenon has not been elucidated, it is believed to be due to the action of an internal stress setting up in the transparent conductive layer because of a difference in thermal expansion coefficient between the substrate and the transparent conductive layer.

Specifically, in deposition of the transparent conductive layer on the substrate by vacuum evaporation, the substrate is heated at a temperature of 300° C. or lower to raise the degree of oxidation of the deposited layer for the purpose of improving the transparency and electroconductivity thereof. The thermal expansion coefficient of the substrate is $5.5 \times 10^{-5}$ cm/cm/°C. in the case of polyether-sulfone (PES) and $1.5 \times 10^{-5}$ cm/cm/°C. in the case of polyethylene terephthalate (PET), while the thermal expansion coefficients of, for example, indium oxide ($In_2O_x$, $x \leq 3$) and indium-tin oxide (ITO) are of the order of $10^{-6}$ cm/cm/°C. Thus, there is a large difference in thermal expansion coefficient between the substrate and the transparent conductive layer. Therefore, it is believed that, at room temperature, an internal stress may set up in the transparent conductive layer due to shrinkage of the substrate, and corrosion may progress in an acid or alkali solution with the aid of the internal stress to cause cracking or local peeling.

On the other hand, there has been proposed a two-layer transparent conductive film having an indium oxide film formed on a transparent substrate and a tin oxide film subsequently formed thereon (Japanese Patent Laid-Open No. 22,789/1977). Use of this transparent conductive film as a transparent electrode plate in, for example, an element of a liquid crystal display device aims at maintaining its transparency and electroconductivity after a heat treatment which is performed by heating at 500° C. or higher in securing sealing of a panel with a glass sealing material.

This transparent conductive film involves problems that the resistance of the film against the above-mentioned acid or alkali is reduced when pinholes or cracks are present in the tin oxide layer; that patterning is difficult because of grave side etching due to a large difference in solubility between the indium oxide layer and the tin oxide layer; and that provision of the indium oxide layer on the side of the substrate provides no satisfactory acid or alkali resistance so that cracking or peeling is liable to occur.

DISCLOSURE OF INVENTION

An object of the present invention is to provide a conductive laminate having a sufficient acid and alkali resistance, which solves the above-mentioned problems involved in conventional conductive laminates.

Specifically, the present invention provides a conductive laminate comprising a substrate and a transparent conductive layer formed thereon and made of a crystalline metal or metallic oxide, characterized by comprising an intermediate layer provided between the substrate and the transparent conductive layer and made of an amorphous metallic or semimetallic oxide.

In the present invention, usable materials of the substrate include inorganic materials such as quartz glass, soda glass, potassium glass, and other glass; and organic polymer materials such as polyethylene terephthalate (PET), polyethylene naphthalate, polyhexamethylenediamide, poly-γ-butyramide, poly-m-xylenediamine terephthalamide, aromatic polyesters or aromatic polyester carbonates mainly prepared from bisphenol A, its halogenated derivative and an acryl dichloride, polyamide copolymers of m-phenylenediamine, isophthalic acid and terephthalic acid, polycarbonate, polypropylene, polyimides, polyamides, imido-polybenzimidazole, polyethersulfone (PES), polyether ether ketone, polysulfone, polyether imide, and triacetylcellulose. They may have a polarizing filter function. When stretching is necessary in the manufacture of them, either monoaxial or biaxial stretching may be effected.

A plurality of polymer resins may be laminated or mixed on the surface opposite the surface of the substrate on which the intermediate layer and the transparent conductive layer are formed. For example, a coat of Saran which is a polyvinylidene chloride resin may be superposed as a barrier layer for prevention of water permeation. A layer having other functions such as prevention of reflection or scratch, or a layer of a gas barrier resin may also be laminated.

When a polyvinylidene chloride material, for example, Saran Latex (registered trademark) L 520 or L 511 manufactured by Asahi Chemical Industry Co., Ltd., is applied on a polymer film substrate by a wire bar, a very high water-permeation-proof effect is secured.

Conditions of such coating may include, for example, use of a PET or PES film of 100 μm in thickness as the substrate, dilution of a Saran Latex stock solution (solids content: 48%) with water 1.0 to 3-fold, a wet wire bar coating thickness of 3 to 60 μm, a carrying rate of 100 to 200 m/min, drying with hot air of 90° to 140° C., and a dry coating layer thickness of 1 to 30 μm.

The thickness of the substrate is preferably 0.2 to 20 mm in the case of a glass substrate and 100 μm in the case of an organic polymer substrate.

The transparent conductive layer is made of a crystalline material, which is preferably a thin metallic film of Au, Pd, Cr, or Ni; or a film of a metallic oxide such as $SnO_2$, $In_2O_3$, ZnO, $TiO_2$, CdO, $CdO-SnO_2$, ITO (indium tin oxide) as mentioned above, or the like. The thickness of the transparent conductive layer is preferably 200 to 10,000 Å, particularly preferably 200 to 1,000 Å. Indium oxide ($In_2O_3$) and ITO having a tin content (the proportion of tin relative to the total of tin and indium, Sn/Sn+In; the same will apply hereinafter) of less than 7% are especially preferred, and those containing Cd, Zn, Al, or the like in addition to the above-mentioned component can also be used.

The intermediate layer provided between the substrate and the transparent conductive layer is made of an amorphous material, which is preferably one containing a component selected from among not only ITO and tin oxide ($SnO_2$) but also insulating metallic or semi-metallic oxides such as silicon oxide ($SiO_2$) and aluminum oxide ($Al_2O_3$). Tin oxide ($SnO_2$) and ITO having a tin content of 7% or more, preferably 10% or more, are especially preferred. The thickness of the intermediate layer is preferably 80 Å or more, particularly preferably 80 to 300 Å. Formation of the intermediate layer is performed by reactive vacuum evaporation and deposition or reactive sputtering.

BRIEF DESCRIPTION OF DRAWINGS

All the drawings will illustrate examples of the present invention.

BEST MODE FOR CARRYING OUT THE INVENTION

Figure 1:
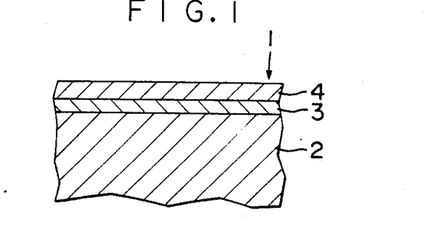
FIG. 1 is a cross-sectional view of a conductive laminate.

The present invention will now be illustrated with reference to the attached drawings. FIG. 1 shows a cross-sectional view of a conductive laminate 1 according to the present invention, which has a substrate 2, and an intermediate layer 3 and a transparent conductive layer 4 deposited thereon in sequence. A layer made of an inorganic substance such as $Al_2O_3$ for the purpose of improving the light transmittance by means of, for example, a light interference effect, a layer made of a polymer substance, or other additional intermediate layer (which may be crystalline) may be provided between the intermediate layer and the transparent conductive layer.

An example in which indium oxide or ITO is used as the material of the transparent conductive layer will now be described.

The process of embodying the present invention will be first described. In the following tests, PES or monoaxially or biaxially stretched PET having a thickness of 100 μm was used as the substrate, while formation of a intermediate layer and a transparent conductive layer was performed by reactive vacuum evaporation and deposition (source of evaporation: In, In-Sn, $In_2O_3$, ITO) or reactive sputtering (target: In, In-Sn, $In_2O_3$, ITO).

Preparatory Test 1

As to a conventional conductive laminate having no intermediate layer, a relationship between the tin content and the sheet resistance of a transparent conductive layer was examined. The film formation temperature (temperature of a substrate in vacuum deposition) was 10° to 200° C., and the thickness of the resulting film was 600 Å.

Figure 2:
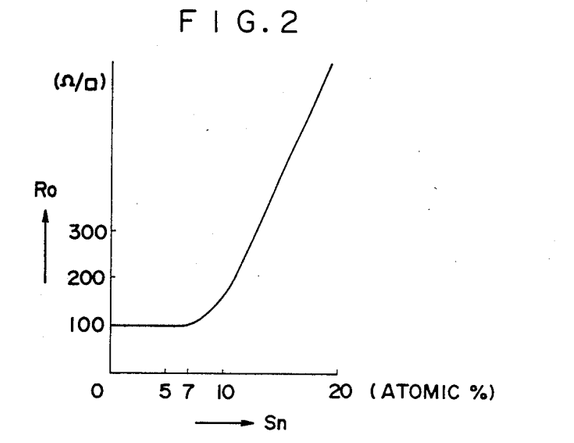
FIG. 2 is a graph showing a relationship between the tin content and the sheet resistance of a transparent conductive layer.

The test results are shown in FIG. 2.

The sheet resistance R remains substantially constant at 100 Ω/□ up to a tin content of 7 atomic %, begins to gradually increase when it exceeds 7 atomic %, and reaches 170 Ω/□ at a tin content of 10 atomic %. When the tin content exceeds 10 atomic %, the sheet resistance begins to increase rapidly, with the result that a difficulty may be encountered in controlling the sheet resistance on a given level while a low resistance value cannot be secured. Accordingly, the tin content of the transparent conductive layer is desired to be 7 atomic % or lower.

Preparatory Test 2

(i) As to a conventional conductive laminate having no intermediate layer, the acid resistance was examined based on a relationship between the temperature of the substrate in film formation (film formation temperature) and a change in the sheet resistance before and after immersion in an acid. The film formation temperature was in a range of from 10° to 200° C. The transparent conductive layer was made of indium oxide or ITO having a tin content of up to 10 atomic %, and had a thickness of 500 Å. The acid was 0.05N hydrochloric acid. The liquid temperature was 20° C., and the immersion time was 30 minutes.

When the sheet resistances before and after immersion in the acid are expressed by $R_0$ and $R$, respectively, the film formation temperature for providing $R/R_0 \leq 2$ ($R/R_0$ is desired to be close to 1 and at most 2.0) varies depending on the tin content of the transparent conductive layer as shown in the following Table 1.

TABLE 1

| Tin content | Necessary film formation temperature |
| --- | --- |
| 0 at. % | 90° C. or higher |
| 1 at. % | 130° C. or higher |
| 3 at. % | 140° C. or higher |
| 5 at. % | 150° C. or higher |
| 8 at. % | 180° C. or higher |
| 10 at. % | 200° C. or higher |

In the table, at. % stands for atomic % (the same will apply hereinafter).

It can be understood from the table that the film formation temperature must be higher with a higher tin content of the transparent conductive layer in order to provide a value of $R/R_0$ of 2.0 or less.

Although the value of $R/R_0$ was 2.0 or less under the conditions listed in Table 1, cracks were formed in the transparent conductive layer after immersion in an acid. Thus, the acid resistance was not satisfactory. It was found that transparent conductive layers prepared at necessary film formation temperatures as listed in Table 1 included crystalline matters since diffraction patterns were observed in the X-ray diffraction test. In view of this, it is effective to make the transparent conductive layer crystalline for the purpose of at least attaining $R/R_0$ of $\leq 2.0$ in respect of acid resistance.

(ii) While keeping the tin content of the transparent conductive layer at 3 atomic %, a relationship between the film formation temperature and the alkali resistance was examined to obtain the results listed in Table 2. The alkali resistance was evaluated by a change in the sheet resistance before immersion ($R_0$) and after immersion ($R$) in a 5 wt. % aqueous KOH solution (20° C.) for 10 minutes and a change in the surface state.

In the table, o, Δ, and x stand for the respective states as mentioned below (the same will apply hereinafter).

o: $R/R_0 \leq 2.0$, neither cracking nor peeling was observed.
Δ: $R/R_0 \leq 2.0$, cracking occurred but no peeling was observed.
x: $R/R_0 > 2.0$, cracking and peeling occurred.

TABLE 2

| Film formation temperature | Acid resistance | Alkali resistance | X-ray diffraction test |
| --- | --- | --- | --- |
| 50° C. | x | o | amorphous |
| 80° C. | x | Δ | amorphous and crystalline |
| 140° C. | Δ | Δ | crystalline |
| 150° C. | Δ | Δ | |
| 180° C. | Δ | x | |
| 200° C. | Δ | x | |

In the case of film formation temperatures higher than the necessary film formation temperature (tin: 3 atomic %; 140° C. or higher), cracking occurred in respect of acid resistance, but $R/R_0 \leq 2.0$. In respect of alkali resistance, as the temperature was higher, surface cracking caused by immersion in an alkali turned out more notable sometimes with peeling, and $R/R_0$ exceeded 2.0 when the temperature is higher than a given one.

It is believed that occurrence of cracking in a transparent conductive layer during immersion in an acid or alkali in the case of higher film formation temperatures might have been induced by an increased internal stress setting up in the transparent conductive layer due to a difference in thermal expansion coefficient between a substrate and the transparent conductive layer.

As described above, no conductive laminates obtained by directly forming a transparent conductive layer on a substrate could satisfy both the acid and alkali resistances. In Table 2, transparent conductive layers formed at film formation temperatures of 140° C. or higher showed crystallinity in an X-ray diffraction test, while the degree of amorphousness increased with lower film formation temperature in the case of those formed at 80° C. or lower.

As is understood from the above results, formation of the transparent conductive layer must be performed at or above a given temperature depending on the tin content (to provide crystallinity) in order to reduce $R/R_0$ in respect of acid resistance, while elevation of the film formation temperature leads to an increased trend of causing cracking in respect of acid and alkali resistances. Although an increase in $R/R_0$ is little when cracks formed in the transparent conductive layer are fine, even fine cracks cause disconnection of wirings when patterning is so made as to give a fine pattern to the transparent conductive layer (particularly when fine wirings are provided). This will provide inoperative portions in liquid crystal and other display devices with a conductive laminate of the kind as described above. Thus, even fine cracks seriously damage conductive laminates in such a case.

Under these circumstances, it would be a great convenience if occurrence of cracking could be prevented even in the case of higher film formation temperatures.

Preparatory Test 3

In conductive laminates as shown in FIG. 1, in which ITO was used as the material of an intermediate layer 3, examination was made of the tin content of the intermediate layer at which neither cracking nor peeling in a transparent conductive layer 4 is caused by immersion in an acid. The transparent conductive layer 4 was formed from indium oxide or ITO containing 0 to 7 atomic % of tin at a film formation temperature of 90° to 300° C., particularly 100° to 200° C. (100° C. in the case of 0 atomic % of Sn, 200° C. in the case of 6 atomic % of Sn). The thickness of the layer 4 was 400 Å.

The intermediate layer 3 was formed at a film formation temperature of 20° to 200° C. (preferably 50° to 100° C.), and had a thickness of 200 Å.

Examination was made of the tin content of the intermediate layer at which neither cracking nor peeling in the transparent conductive layer is caused with maintenance of $R/R_0 \leq 2.0$ by the same immersion in an acid as in the above-mentioned Preparatory Test 2.

The results are shown in the following Table 3, in which film forming temperature $T_s$ are mentioned together.

TABLE 3

| Transparent conductive layer | Intermediate layer |
| --- | --- |
| Sn: 0 at. % | Sn: 7 at. % or more |

TABLE 3-continued

| Transparent conductive layer | Intermediate layer |
|---|---|
| $T_s$: 90~140° C. | $T_s$: 20~200° C. preferably 20~100° C. |
| Sn: 1~2 at. % | Sn: 8 at. % or more |
| $T_s$: 140~200° C. | $T_s$: 50~200° C. preferably 50~150° C. |
| Sn: 5~7 at. % | Sn: 10 at. % or more |
| $T_s$: 180~200° C. | $T_s$: 50~200° C. |

The following matter can be understood from Table 3. In order to meet the above-mentioned requirements, the tin content of the intermediate layer must be higher as the tin content of the transparent conductive layer is higher, and the tin content of the intermediate layer must be always higher than that of the transparent conductive layer.

The reasons for this fact is believed to be as follows. With a higher tin content in the transparent conductive layer, the temperature of forming the layer must be higher (see the above-mentioned Preparatory Test 2). Thus, the internal stress setting up in the transparent conductive layer may increase due to a difference in thermal expansion coefficient between the transparent conductive layer and the substrate. The above-mentioned internal stress can be relaxed by providing an intermediate layer with a further higher tin content between the substrate and the transparent conductive layer to prevent cracking or peeling during immersion in an acid.

Preparatory Test 4

As to conductive laminates 1 as shown in FIG. 1, in which amorphous tin oxide was used as the material of the intermediate layer 3, examination was made of a relationship between the thickness of the intermediate layer and the change $R/R_0$ in the sheet resistance before and after immersion in an acid. The film formation temperature was 200° C. or lower, for example, 100° C. The transparent conductive layer 4 was formed from indium oxide or ITO containing 0 to 7 atomic % of tin at or above a necessary film formation temperature as listed in Table 1, particularly at 100° to 200° C. (100° C. in the case of 0 atomic % of tin, 200° C. in the case of 6 atomic % of tin), and had a thickness of 400 Å. The $R_0$ was 400 to 600 Ω/□, and the light transmittance before immersion in an acid was 82 to 75%. The thickness of the layer was measured with a tallystep when it was 300 Å or more, while a smaller thickness was calculated from the rate of evaporation and the time of film formation (the same will apply in the tests mentioned later).

Figure 3:
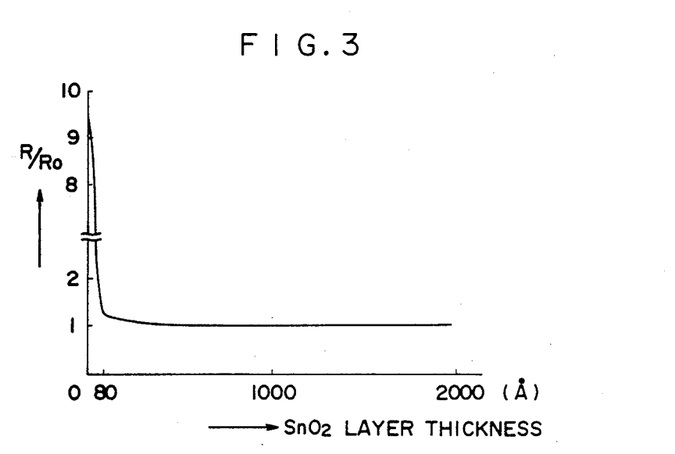
FIG. 3 is a graph showing a relationship between the thickness and the changes in the sheet resistance of a tin oxide intermediate layer which is caused by immersion in an acid.

The test results are shown in FIG. 3.

When the thickness of the intermediate layer was 80 Å or less, the value of $R/R_0$ drastically increased. This was caused by formation of many cracks in the transparent conductive layer by immersion in the acid (peeling occurred in some cases).

The value of $R/R_0$ was 1.4 when the thickness of the intermediate layer was 80 Å, decreased with an increase in the thickness of the intermediate layer, and reached 1 when the thickness of the intermediate layer was 500 Å or more. When the thickness of the intermediate layer was 80 Å or more, no cracks were observed in the transparent conductive layer.

When the material of the intermediate layer was ITO containing 10 atomic % of tin, substantially the same results were obtained. The intermediate layer was amorphous in an X-ray diffraction test, while the transparent conductive layer was crystalline.

As is understood from the above results, it is preferred that the intermediate layer be 80 Å or more and amorphous, and that the transparent conductive layer be crystalline (substantial crystallinity as a whole will suffice even if it may contain some amorphous portions).

Preparatory Test 5

As to conductive laminates 1 as shown in FIG. 1, the transparent conductive layer 4 was formed from indium oxide or ITO containing less than 7 atomic % of tin, for example, 6 atomic % of tin, and had a thickness of 400 Å. The film formation temperature was 100° to 140° C. in the case of the former and 200° C. in the case of the latter.

The intermediate layer 3 was formed from ITO containing 7 atomic % or more of tin oxide in this example. Examination was made of a relationship between the thickness of the intermediate layer and the change $R/R_0$ in the sheet resistance before and after immersion in a 5 wt. % aqueous KOH solution (20° C.) for 10 minutes together with observation of the surface state. The film formation temperature for the intermediate layer was 20° to 200° C., in this case, 50° to 100° C.

When the transparent conductive layer 4 was formed from ITO containing 6 atomic % of tin, the sheet resistance $R_0$ before immersion in the aqueous KOH solution was 400 to 300 Ω/□, and the light transmittance was 80% or higher.

The test results are shown in Table 4. In the table, o, Δ, and x stand for the respective states as mentioned below (the same will apply hereinafter).

o: $R/R_0 \leq 2.0$, neither cracking nor peeling was observed.

Δ: $R/R_0 \leq 2.0$, cracking occurred but not peeling was observed.

x: $R/R_0 \leq 2.0$, cracking and peeling occurred.

TABLE 4

| Thickness of intermediate layer (Å) | Rating (alkali resistance) |
|---|---|
| 0 | x |
| 50 | Δ |
| 70 | o |
| 100 | o |
| 300 | o |
| 500 | o |
| 700 | o |
| 1000 | o |

When the thickness of the intermediate layer was 70 Å or more, the value of $R/R_0$ was 2.0 or less, and neither cracking nor peeling was observed.

Preparatory Test 6

As to conductive laminates 1 as shown in FIG. 1, in which the intermediate layer 3 was formed from indium oxide, ITO having a varied tin content of 1 to 30 atomic %, or tin oxide at a film formation temperature of 20° to 200° C. (70° C. in this case), and had a thickness of 200 Å, a relationship between the tin content of the intermediate layer 2 and the alkali resistance was examined by conducting the same test as in the above-mentioned test 5. The sheet resistance $R_0$ before immersion in an aqueous KOH solution was 400 to 300 Ω/□, and the light transmittance was 80% or higher.

The test results are shown in Table 5.

TABLE 5

| Tin content of intermediate layer (at. %) | Rating (alkali resistance) |
| --- | --- |
| 0 | x |
| 1 | x |
| 3 | Δ |
| 4 | Δ |
| 7 | o |
| 10 | o |
| 25 | o |
| 30 | o |
| tin oxide alone | o |

When the tin content of the intermediate layer was 7 atomic % or more, the value of $R/R_0$ was 2.0 or less, and neither cracking nor peeling was observed.

The results of the tests 1 to 6 are summarized as follows.

(a) The acid resistance is improved under the following conditions.

(1) The tin content of the intermediate layer is higher than that of the transparent conductive layer, and is desirably 7 atomic % or more, preferably 10 atomic % or more.

(2) The thickness of the intermediate layer is 80 Å or more. The film formation temperature for the intermediate layer has only to be lower than a temperature below which the substrate is resistant to the temperature. In the case of, for example, PES, it has only to be 200° C. or lower.

(3) The tin content of the transparent conductive layer is 10 atomic % or less, preferably 7 atomic % or less.

(4) It is preferred that the film formation temperature for the transparent conductive layer be higher as the tin content thereof is higher, and be as listed in Table 1 in accordance with the tin content, provided that it is lower than a temperature below which the substrate is resistant to the temperature. It is 200° C. or lower in the case of, for example, PES.

(b) The alkali resistance is improved under the following conditions.

(5) The same as mentioned in (1) above.

(6) The same as mentioned in (2) above except that the thickness of the intermediate layer is 70 Å or more.

Examples according to the present invention will now be specifically described together with comparative examples.

As to conductive laminates having respective intermediate layers with various tin contents between respective substrates and transparent conductive layers, the same acid and alkali resistance tests as described above were conducted.

Figure 4:
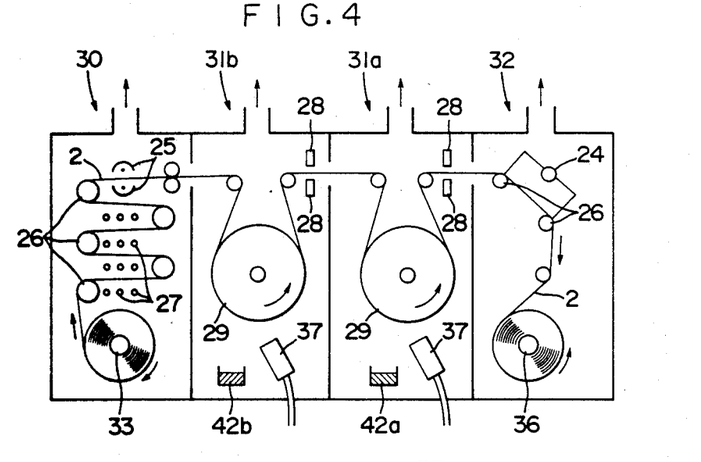
FIG. 4 is a rough cross-sectional view of a vacuum deposition apparatus used for film formation.

Using a vacuum evaporation and deposition apparatus as shown in FIG. 4, an intermediate layer and a transparent conductive layer were deposited in sequence on that surface of a PES sheet of 100 μm in thickness having a water-permeation-proof vinylidene chloride resin layer of 1 to 30 μm, for example, 20 μm, in thickness applied thereon which was remote from the water-permeation-proof layer. Thus, a transparent conductive laminate was prepared.

The vacuum evaporation and deposition apparatus is partitioned into compartments 30, 31b, 31a, and 32. A wind-up roll 36 and a feed roll 33 for a sheet substrate 2 are disposed in the compartments 32 and 30, respectively, on both sides. The substrate 2 is continuously carried between both the rolls while subjecting the same to the following treatments.

The sheet substrate 2 is first carried in a zigzag direction over five conveyor rollers 26 in the compartment 30 while preliminarily heating the same by halogen heater lamps 27 disposed in the zigzags of the sheet substrate 2 to remove adsorbed water from the sheet substrate 2, followed by an electric discharge treatment in an electric discharge apparatus 25 to clean the sheet substrate.

The operation conditions in the compartment 30 are as follows.

Heating temperature: 80° to 150° C.;
Reduced pressure $10^{-4}$ to $10^{-5}$ Torr;
Electric discharge treatment: Gas for use is an $O_2$ gas, an Ar gas, or an $Ar+O_2$ mixture gas; DC or AC discharge (0 to 1000 W, 0 W standing for no electric discharge treatment).

The sheet substrate 2 is then carried into the compartment 31b, where a vapor generated from an evaporation source 42b was deposited on the sheet substrate 2 maintained at a predetermined temperature by close contact with a constant-temperature roller 29 (capable of controlling the temperature at $-10°$ to 250° C.) to form an intermediate layer. The thickness of the intermediate layer is monitored and controlled by a quartz vibration type film thickness monitor 28. The operation conditions in the compartment 31b are as follows.

Evaporation source 42b: Sn, binary evaporation of Sn and In, $SnO_2$, or ITO containing 7 atomic % or more of Sn;
Heating method: heating with an electron gun ($SnO_2$ or ITO), resistance heating (Sn, or binary evaporation of Sn and In);
Gas electric discharge apparatus 37: high-frequency electric discharge (the details will be given later);
Evaporation rate: 100 to 1,000 Å/min;
Oxygen pressure: $5 \times 14^{-4}$ to $3.0 \times 14^{-3}$ Torr;
High-frequency power: 200 to 800 W (13.56 MHz);
Maintained substrate temperature: 50° to 100° C.

Subsequently, the sheet substrate 2 is carried into the compartment 31a having the same structure as that of the compartment 31b, where a transparent conductive layer is formed on the intermediate layer. The operation conditions in the compartment 31a are as follows.

Evaporation source 42a: In or ITO containing 10 atomic % or less of Sn;
Heating method: heating with an electron gun or resistance heating;
Electric discharge apparatus 37: the same as mentioned above;
Evaporation rate: 100 to 2,000 Å/min;
Oxygen pressure: $3 \times 10^{-4}$ to $3.0 \times 10^{-3}$ Torr;
High-frequency power: the same as mentioned above;
Maintained substrate temperature: 90° C. or higher, for example, 130° C., in the case of an evaporation source containing no Sn, 180° C. or higher, for example, 190° C., in the case of an evaporation source containing 5 atomic % of Sn, and the same as in the compartment 31b in other cases.

Finally, the sheet substrate 2 is carried into the compartment 32, where the sheet resistance is measured between two conveyor rollers 26 with a sheet resistance monitor 24 and the substrate is wound up on the wind-up roll 36.

Figure 5:
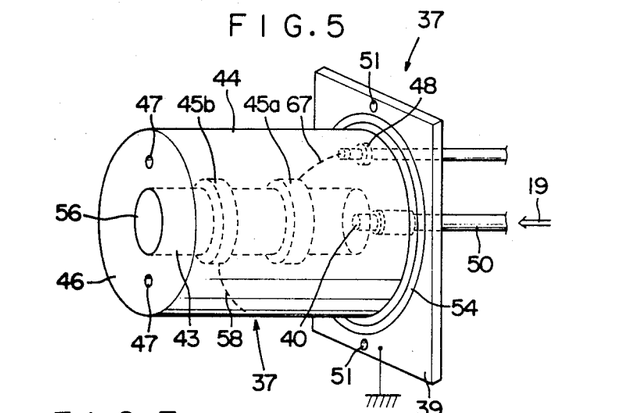
FIG. 5 is a perspective view of a gas electric discharge apparatus provided in the vacuum deposition apparatus.

The high-frequency electric discharge apparatuses 37 disposed in the compartments 31b and 31a will now be illustrated in detail.

As shown in FIG. 5, the electric discharge electrodes are a plurality of rings 45a and 45b disposed so as to enclose therein the peripheral surface of a gas (oxygen) feeding tube 43. The whole of the electric discharge apparatus 37 is wound by a water cooling pipe for cooling the apparatus, not shown in the figure. One ring electrode 45a is connected through a lead wire 67 with a high frequency input terminal 48, while the other ring electrode 45b is connected through a lead wire 58 with a metallic deposition-proof member 44 which is connected through a metallic attachment plate 39 with ground. The above-mentioned electrodes 45a and 45b consist of, for example, copper, stainless steel or platinum band rings having an inner diameter of 2 to 10 cm and a width of 0.5 to 10 cm, which forms a C coupling type (capacity coupling type) of electric discharge in the feeding tube 43. The above-mentioned band rings become to be able to input a strong high frequency power for a long time when they are cooled by the cooling pipe wound around the apparatus.

The above-mentioned reactive vacuum evaporation and deposition method with the gas electric discharge apparatus 37 is characterized in the following points (1) to (6), as compared with the conventional methods.

(1) Since a reaction gas is activated or ionized by applying a high-frequency voltage to the electric discharge apparatus, not only the reactivity of the gas is enhanced to promote the reaction thereof with an evaporated substance, but also the electric discharge electrodes 45 can be disposed in positions being out of contact with the discharging region in the electric discharge portion of the apparatus. Therefore, the electrodes 45 are not bombarded during discharging so that no electrode materials are incorporated into the gas. Thus, no contamination of a deposited film occurs. On the contrary, if discharging is performed by applying a DC voltage to the electric discharge apparatus, the electrodes must be unfavorably disposed in contact with the discharging region.

(2) The disposition of the electric discharge electrodes 45 around the periphery of the feeding tube 43 can efficiently effectuate ionization or activation of the gas in the feeding tube 43 keeping the gas pressure high without raising the gas pressure in the evaporation space. Accordingly, the amount and rate of the gas being fed can be increased. Since the gas pressure can be reduced in the evaporation space, field acceleration of the evaporated substance becomes unnecessary. Accordingly, not only metals but also oxides can be used as the material to be evaporated, thus expanding the scope of the material to be chosen. Besides, the material of the substrate to be subjected to deposition can be selected from among a wide variety of materials. Thus, formation of a good-quality deposited film is possible. The scope of the substrate temperature to be chosen is expanded, thus facilitating heating and cooling of the substrate.

(3) Since the gas discharging region is limited in the feeding tube 43 and hence separated from the electrodes 45, bombardment of the electrodes with gas ions generated during discharging can be prevented. Thus, evaporation of the electrode materials due to heating and bombardment thereof can be prevented so that contamination of the evaporation space can be prevented.

(4) Since the deposition-proof members 44 and 46 are so disposed as to enclose therein the feeding tube 43 and the electrodes 45, not only adhesion of the evaporated substance to the feeding tube 43, electrodes 45, and high-frequency input terminal 48 can be prevented, but also leakage of high-frequency power through the attachment plate 39, the electrodes 45, and the feeding tube 43 can be effectively prevented to secure stable electric discharge.

(5) Since the gas electric discharge apparatus 37 can be attached in a bell jar with an installing bed by means of a simple structure, attachment and detachment works can be facilitated. When film formation is performed on a substrate having a large area, the positions and number of electric discharge apparatuses can be so optimized by adjustment as to secure uniform film formation. For example, the electric discharge apparatuses can be set in an adequate position(s), or a plurality of discharge apparatuses can be set for the purpose of uniform film formation.

(6) Since the direction of orientation of a gas release opening can be easily changed, electric discharge without disorder can be secured even if the rate of evaporation varies. Particularly when the gas electric discharge apparatus is so set that the gas release opening does not orient somewhere between the evaporation source and the substrate, electric discharge can be continued stably to attain homogeneity in the quality of the deposited film.

(7) When the attachment bed, the electric discharge electrodes 45, and the deposition-proof member 44 are cooled with water, superheating during discharging can be prevented so that a strong high-frequency power can be input to promote the reactive vacuum evaporation and deposition.

Figure 6:
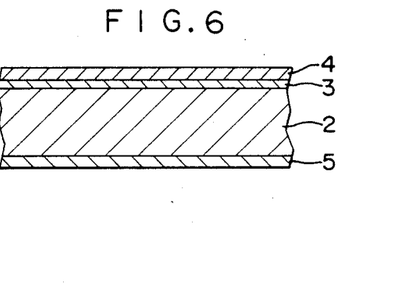
FIG. 6 is a cross-sectional view of another conductive laminate.

Thus, a number of transparent conductive laminates having the interemediate layer 3 and the transparent conductive layer 4 deposited in sequence on one surface of the substrate 2 and the water-permeation-proof layer 5 formed on the other surface of the substrate as shown in FIG. 6 were obtained.

Examination was made of not only the sheet resistance and light transmittance but also the same acid and alkali resistances of each obtained transparent conductive laminate each time it was subjected to the operation conditions in the compartment 31b or 31a.

The results are exemplified in the following Table 6, in which Ts and RF stand for the maintained substrate temperature and the high frequency power, respectively.

TABLE 6

| No. | Transparent conductive layer | Intermediate layer Sn content | Ts | Acid resistance | Alkali resistance | Remarks |
|---|---|---|---|---|---|---|
| 1 | Sn: 0 at. % | $\geq$ 7 at. % | 150° C. or lower | o | o | Ex. |
| 2 | Ts: 90~ | 0 at. % | 100° C. | Δ | x | Comp. Ex. |
| 3 | 150° C. | 7 at. % | 50° C. | o | o | Ex. |
| 4 | | 1 at. % | 170° C. | Δ | x | Comp. Ex. |
| 5 | Sn: 1 at. % | $\geq$ 10 at. % | 160° C. or lower | o | o | Ex. |

TABLE 6-continued

| No. | Transparent conductive layer | Intermediate layer Sn content | Ts | Acid resistance | Alkali resistance | Remarks |
|---|---|---|---|---|---|---|
| 6 | Ts: 130~ | 0 at. % | 90° C. | Δ | Δ | Comp. Ex. |
| 7 | 165° C. | 2 at. % | 160° C. | Δ | x | Comp. Ex. |
| 8 |  | 20 at. % | 50° C. | o | o | Ex. |
| 9 | Sn: 5 at. % | ≧ 20 at. % | 180° C. or lower | o | o | Ex. |
| 10 | Ts: 150~ | 0 at. % | 130° C. | Δ | x | Comp. Ex. |
| 11 | 180° C. | 5 at. % | 180° C. | Δ | x | Comp. Ex. |
| 12 |  | SnO$_2$ ≧ 30 at. % | 100° C. | o | o | Ex. |
| 13 | Sn: 7 at. % | ≧ 20 at. % | 190° C. or lower | o | o | Ex. |
| 14 | Ts: 170~ | 0 at. % | 110° C. | x | x | Comp. Ex. |
| 15 | 190° C. | SnO$_2$ ≧ 30 at. % | 50° C. | o | o | Ex. |

Of these conductive laminates, those excellent in both acid and alkali resistances are conductive laminates Nos. 1, 3, 5, 8, 9, 12, 13, and 15 having a tin content of 7 atomic % or more in their intermediate layers, which were confirmed to be amorphous as a result of an X-ray diffraction test conducted just as they were formed. The intermediate layers of the other conductive laminates were found to contain crystalline portions.

When intermediate layers having the same composition as in the above-mentioned laminates Nos. 1, 5, 9, and 13 were formed at temperatures higher than the film formation temperatures listed in Table 6, crystalline portions were included in the intermediate layers, and conductive laminates each formed by depositing thereon a transparent conductive layer were observed to give rise to cracking and/or peeling in the transparent conductive layer when immersed in either an acid or an alkali. The same phenomenon was observed when the tin contents of the intermediate layers were decreased in those corresponding to the above-mentioned laminates Nos. 1, 5, 9, and 13 though the film formation temperatures therefor were the same as in the above-mentioned laminates.

It is understood from the above results that the intermediate layer is more apt to become amorphous as the tin content of the intermediate layer is higher and as the film formation temperature for the intermediate layer is lower, leading to improvements in the acid and alkali resistances of a conductive laminate comprising therein the intermediate layer.

This is belived to be due to the following reasons. (1) As the film formation temperature is lower, the deposited layer is more easily quenched due to absorption of its heat by the substrate during vacuum evaporation and deposition to tend to become amorphous. (2) As the tin content of the ITO-deposited layer is higher, the intermediate layer tends to become amorphous. (3) Therefore, as the tin content of the ITO-deposited layer is higher, the upper limit of the film formation temperature at which amorphousness can be secured is higher.

When an amorphous intermediate layer was formed from silicon oxide (SiO$_2$) or aluminum oxide (Al$_2$O$_3$) at a film formation temperature of 150° C. or lower for the former or 170° C. or lower for the latter according to reactive vacuum evaporation and deposition or reactive sputtering, a conductive laminate formed by forming thereon a transparent conductive layer also showed excellent acid and alkali resistances like the above-mentioned examples.

Figure 7:
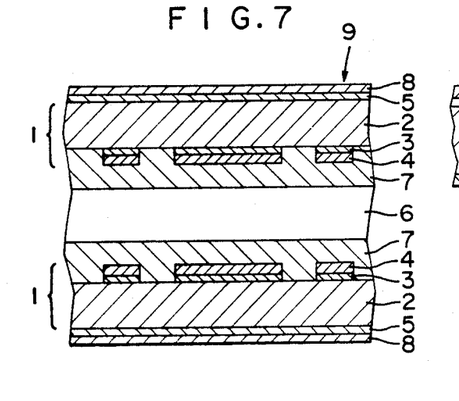
FIG. 7 is a cross-sectional view of a liquid crystal display device.

An example of a liquid crystal display formed by effecting pattern etching of the transparent conductive and intermediate layers of the conductive laminate according to the present invention in a predetermined pattern is shown in FIG. 7.

The liquid crystal display 9 comprises transparent conductive laminates 1 having an intermediate layer 3 and a transparent conductive layer 4 deposited in sequence with patterning on a transparent substrate 2, the transparent conductive layers of which confront with each other, and which sandwich a liquid crystal 6 via orientation films 7. A water-permeation-proof layer 5 and a polarizing filter 8 are provided in sequence on the outer side of each transparent substrate 2.

The conductive laminate according to the present invention can be suitably used in various display devices such as not only a liquid crystal display device but also electroluminescence, electrochromic, and fluorescence display devices.

Industrial Applicability

As described above, since the conductive laminate according to the present invention has a structure comprising a substantially amorphous intermediate layer or an intermediate layer capable of providing chemical resistance to a transparent conductive layer between a substrate and the transparent conductive layer, the acid and alkali resistance of it are high. When the laminate is used in, for example, a liquid crystal display, neither cracking nor peeling in the surface portion of the laminate occurs even if it was washed with an alkali in the post-treatment of patterning to remove a resist, or even if it is washed with an acid to clean the surface of the transparent conductive layer. Thus, it can be used with sufficient reliability.

We claim:

1. A conductive laminate characterized by providing in sequence an intermediate layer made of an amorphous metallic oxide or an amorphous semi-metallic oxide and a transparent conductive layer made of a crystalline metal or a crystalline metallic oxide on a transparent substrate.

2. A conductive laminates as claimed in claim 1, wherein the material of said conductive layer is a member selected from among Au, Pd, Cr, Ni, SnO$_2$, In$_2$O$_3$, ZnO, TiO$_2$, CdO, CdO-SnO$_2$, and ITO.

3. A conductive laminate as claimed in claim 1, wherein the material of said intermediate layer is a member selected from among SnO$_2$, ITO, SiO$_2$, and Al$_2$O$_3$.

4. A conductive laminate as claimed in claim 1, wherein said conductive layer is made of In$_2$O$_3$ or ITO having a tin content of less than 7 atomic %, and said intermediate layer is made of ITO having a tin content of 7 atomic % or more or SnO$_2$.

5. A conductive laminate as claimed in claim 4, wherein the tin content of ITO in said intermediate layer is 10 atomic % or more.

6. A conductive laminate as claimed in claim 1, wherein the thickness of said conductive layer is 200 to 10,000 Å.

7. A conductive laminate as claimed in claim 1, wherein the thickness of said intermediate layer is 80 to 300 Å.

8. A conductive laminate as claimed in claim 1, wherein the material of said substrate is a member selected from among inorganic materials such as quartz glass, soda glass, potassium glass, and other glass; and organic polymer materials such as polyethylene terephthalate (PET), polyethylene naphthalate, polyhexamethylenediamide, poly-γ-butyramide, poly-m-xylenediamine terephthalamide, aromatic polyesters or aromatic polyester carbonates prepared mainly from bisphenol A, its halogenated derivative and an acyl dichloride, polyamide copolymers of m-phenylenediamine, isophthalic acid and terephthalic acid, polycarbonate, polypropylene, polyimides, polyamides, imidopolybenzimidazole, polyethersulfone PES), polyether ether ketone, polysulfone, polyether imide, and triacetylcellulose.

* * * * *